United States Patent
Yang et al.

(10) Patent No.: US 8,935,145 B2
(45) Date of Patent: Jan. 13, 2015

(54) APPARATUS FOR SIMULATING BATTERY SYSTEM

(75) Inventors: Jong-Woon Yang, Yongin-si (KR); Eui-Jeong Hwang, Yongin-si (KR)

(73) Assignee: Samsung SDI Co., Ltd., Giheung-gu, Yongin-si, Gyeonggi-so (KR)

(*) Notice: Subject to any disclaimer, the term of this patent is extended or adjusted under 35 U.S.C. 154(b) by 341 days.

(21) Appl. No.: 13/565,992

(22) Filed: Aug. 3, 2012

(65) Prior Publication Data

US 2013/0151227 A1    Jun. 13, 2013

(30) Foreign Application Priority Data

Dec. 12, 2011 (KR) ........................ 10-2011-0133045

(51) Int. Cl.
*G06F 17/50* (2006.01)
*H02J 7/00* (2006.01)
*H01M 10/48* (2006.01)

(52) U.S. Cl.
CPC ............. *H02J 7/0022* (2013.01); *H01M 10/48* (2013.01)
USPC ............................................... 703/13; 702/63

(58) Field of Classification Search
CPC ........... A47G 23/04; A61N 1/00; A61N 1/08; B60L 11/18; F16H 61/66; G01N 27/416; G01R 29/00; G01R 31/36; G06F 1/26; G06F 1/28; G06F 1/30; G06F 1/32; G06F 17/13; G06F 19/00; G06G 7/54; G08B 3/10; G08B 21/50; G08B 19/00; H01G 9/155; H01M 6/42; H01M 21/00; H01M 21/02; H01M 10/48; H02J 7/0022; H02J 1/00; H02J 4/00; H02J 7/04; H02J 7/00; H04M 1/02
USPC ............... 703/13; 702/63, 183; 320/106, 137, 320/152; 429/150; 126/500; 713/300
See application file for complete search history.

(56) References Cited

U.S. PATENT DOCUMENTS

| | | | | |
|---|---|---|---|---|
| 6,016,047 A | * | 1/2000 | Notten et al. | 320/137 |
| 2002/0130634 A1 | * | 9/2002 | Ziemkowski et al. | 320/106 |
| 2002/0138772 A1 | * | 9/2002 | Crawford et al. | 713/300 |
| 2007/0204859 A1 | * | 9/2007 | Little et al. | 126/500 |
| 2008/0294380 A1 | * | 11/2008 | Ito et al. | 702/183 |
| 2010/0036627 A1 | * | 2/2010 | Bergveld et al. | 702/63 |
| 2010/0085019 A1 | * | 4/2010 | Masuda | 320/152 |
| 2010/0235007 A1 | | 9/2010 | Constien | |
| 2010/0261048 A1 | * | 10/2010 | Kim et al. | 429/150 |
| 2012/0022816 A1 | * | 1/2012 | Zenati et al. | 702/63 |
| 2012/0143542 A1 | * | 6/2012 | Wu | 702/63 |

FOREIGN PATENT DOCUMENTS

| | | |
|---|---|---|
| KR | 10-0428342 B | 4/2004 |
| KR | 2004-0043806 A | 5/2004 |
| KR | 2005-0005694 A | 1/2005 |

* cited by examiner

*Primary Examiner* — Kandasamy Thangavelu
(74) *Attorney, Agent, or Firm* — Robert E. Bushnell, Esq.

(57) ABSTRACT

A battery system simulation apparatus that enables a battery system to be stably driven by using simulation data. The battery system simulation apparatus includes a voltage simulator that outputs an imaginary simulation voltage corresponding to a battery included in a battery system, to a battery management unit for controlling the battery, and a simulation verification unit that receives control results of the battery which is generated in dependence upon the imaginary simulation voltage. The control results are transmitted by the battery management unit.

13 Claims, 4 Drawing Sheets

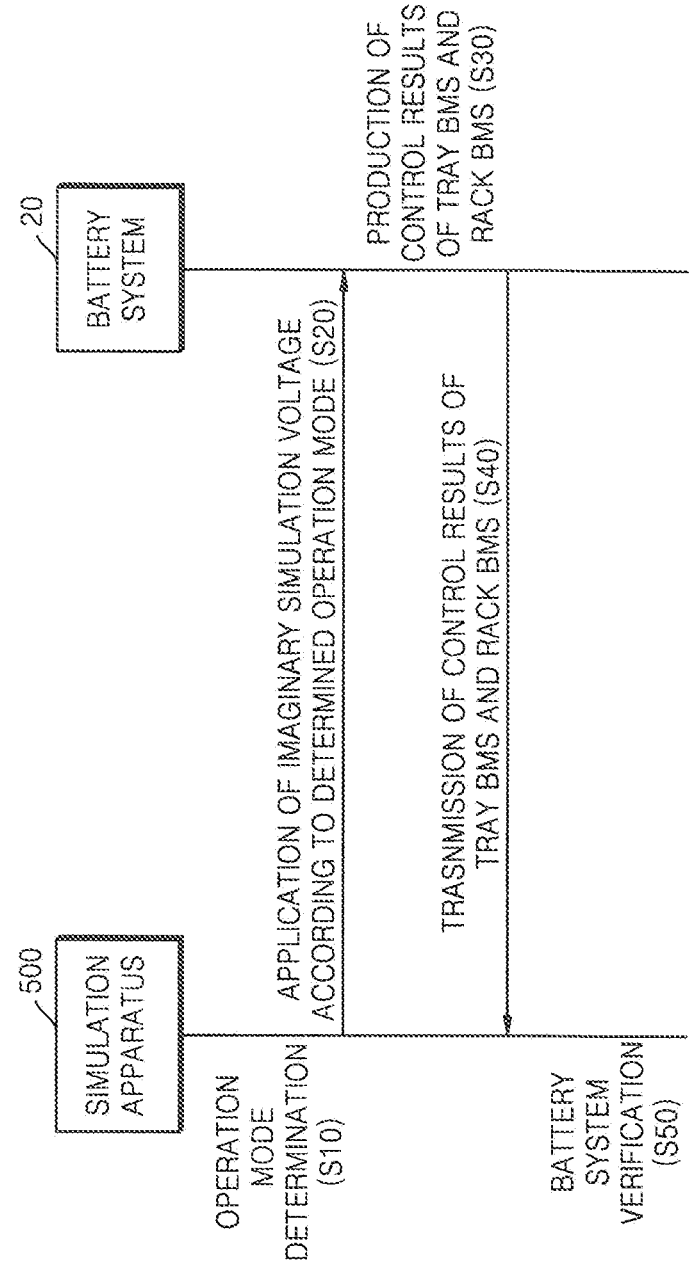

APPARATUS FOR SIMULATING BATTERY SYSTEM

CLAIM OF PRIORITY

This application makes reference to, incorporates the same herein, and claims all benefits accruing under 35 U.S.C. §119 from an application earlier filed in the Korean Intellectual Property Office on the 12th of Dec. 2011 and there duly assigned Ser. No. 10-2011-0133045.

BACKGROUND OF THE INVENTION

1. Field of the Invention

One or more embodiments of the present invention relate to an apparatus for simulating a battery system.

2. Description of the Related Art

As issues on environmental destruction and natural source depletion are highlighted, a system for storing power and efficiently using the stored power is drawing more attention. Also, a new regeneration energy that does not cause pollution during power generation is getting attention. An energy storage system is a system that connects new regeneration energy, a battery that stores power, and a conventional power system, and much research has been performed thereon in consideration of environmental changes.

SUMMARY OF THE INVENTION

One or more embodiments of the present invention include a battery system simulation apparatus that is used to test a battery system by using simulation data to enable stable operation of the battery system.

Additional aspects will be set forth in part in the description which follows and, in part, will be apparent from the description, or may be learned by practice of the presented embodiments.

According to one or more embodiments of the present invention, a simulation apparatus includes a voltage simulator that outputs an imaginary simulation voltage corresponding to a battery included in a battery system, to a battery management unit for controlling the battery, and a simulation verification unit that receives control results of the battery which is generated in dependence upon the imaginary simulation voltage. The control results are transmitted by the battery management unit.

The simulation apparatus may further include a storage unit that stores the imaginary simulation voltage corresponding to the battery.

The storage unit may store a plurality of imaginary simulation voltages corresponding to a battery cell and a battery rack, respectively.

The imaginary simulation voltage may indicate charge and discharge states, State Of Charge (SOC)/State Of Power (SOP)/State Of Health (SOH) states, and protection states of excess voltage/low voltage/excess temperature/low temperature/excess current/low current of the battery cell and the battery rack.

The battery system may include a plurality of tray management units for controlling a plurality of battery trays each including at least one battery cell, and a plurality of rack management units for controlling the tray management units.

The voltage simulator may output imaginary simulation voltages corresponding to the battery cells to the tray management units.

The voltage simulator may output an imaginary simulation voltage corresponding to the rack to the rack management unit.

The simulation apparatus may further include a system management unit for controlling the rack management units.

The simulation verification unit may receive battery control results transmitted by the system management unit.

The voltage simulator may output different imaginary simulation voltages according to a normal mode or a user mode.

The voltage simulator may be driven in the normal mode in which an imaginary simulation voltage that varies according to temperature in a stereotyped charge and discharge method is output.

The voltage simulator may be driven in the user mode in which an imaginary simulation voltage that varies according to temperature in a free charge and discharge method is output.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 4 is a flowchart illustrating a method of simulating a battery system, constructed as an embodiment according to the principles of the present invention.

DETAILED DESCRIPTION OF THE INVENTION

Figure 1:
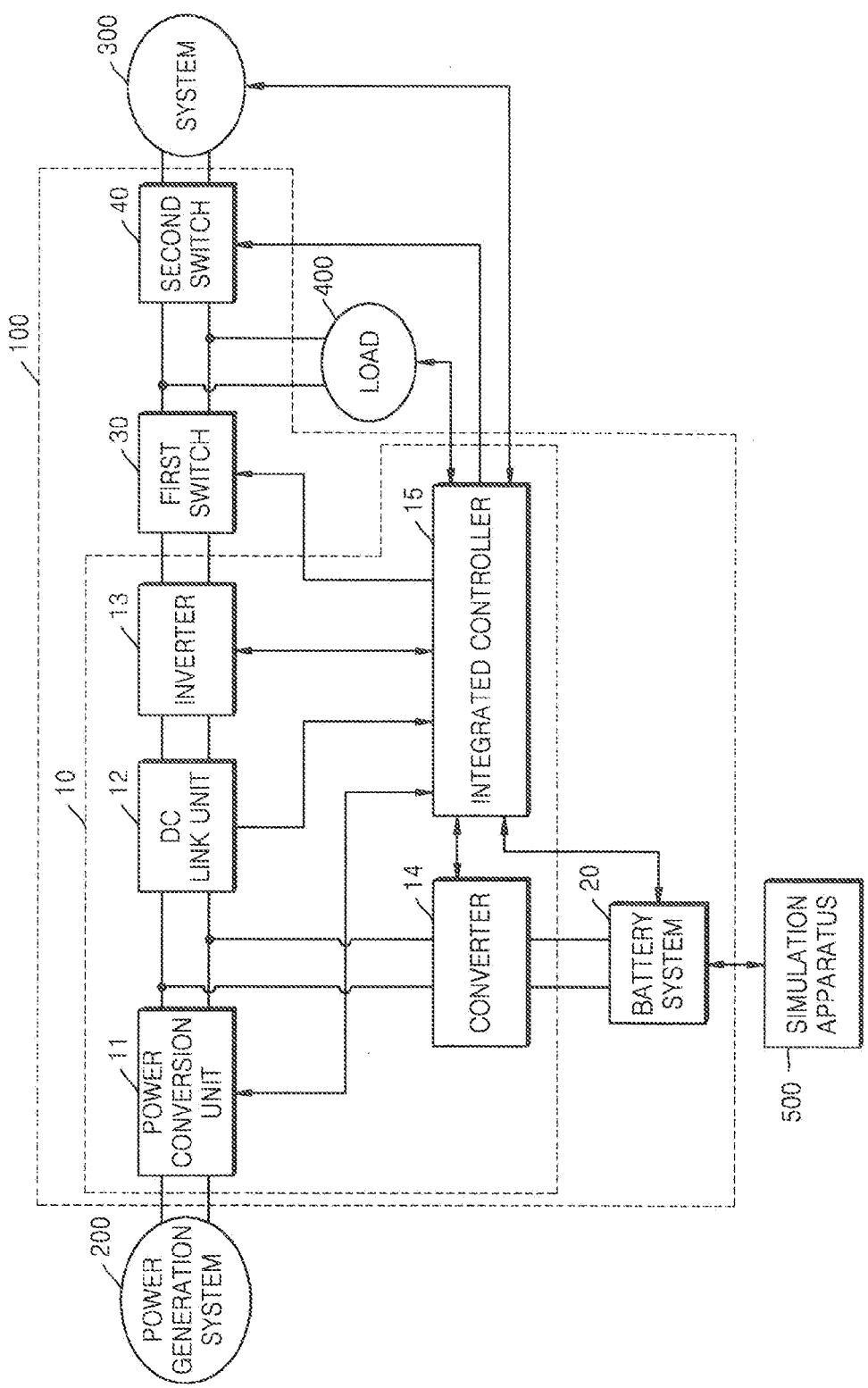
FIG. 1 is a diagram of an energy storage system constructed as an embodiment according to the principles of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the invention may be embodied in many different forms and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc. may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc. are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Exemplary embodiments of the invention will be described below in more detail with reference to the accompanying drawings. Those components that are the same or are in correspondence are rendered the same reference numeral regardless of the figure number, and redundant explanations are omitted.

FIG. 1 is a diagram illustrating a simulation apparatus structure of an energy storage system 100 including a battery system, according to an embodiment of the present invention.

Referring to FIG. I, the energy storage system 100 according to the current embodiment supplies power to a load 400, in association with a power generation system 200 and a system 300.

The power generation system 200 is a system that produces power by using an energy source. The power generation system 200 supplies the power to the energy storage system 100. The power generation system 200 may include any power generation system that generates power by using new regeneration energy, and examples thereof are a solar light power generation system, a wind power generation system, and a tidal power generation system, but are not limited thereto. For example, the power generation system 200 may include any power generation system that produces power by using new regeneration energy, such as solar heat or geothermal heat. In particular, a solar cell that produces electric energy by using solar light may be easily installed in home or a factory, and may be suitable for use in energy storage system 100 distributed in home or the factory. The power generation system 200 includes a plurality of power generation modules in parallel, each of which produces power, thereby embodying a large capacity power system.

The system 300 may include a power generation station, a power substation, a power transmission line, and the like. If the system 300 is in a normal state, the system 300 supplies power to the energy storage system 100 to allow the power to be supplied to the load 400 and/or a battery system 20, and receives power supplied by the energy storage system 100. If the system 300 is in an abnormal state, the power supply from the system 300 to the energy storage system 100 is stopped and the power supply from the energy storage system 100 to the system 300 is also stopped.

The load 400 may consume power produced by the power generation system 200, power stored in the battery system 20, or power supplied by the system 300, and may be, for example, home or a factory.

The energy storage system 100 may store power generated by the power generation system 200 in the battery system 20, and may supply the generated power to the system 300. Also, the energy storage system 100 may supply power stored in the battery system 20 to the system 300, or may store power supplied by the system 300 in the battery system 20. Also, if the system 300 is in an abnormal state, for example, if power interruption occurs, the energy storage system 100 may perform an uninterruptible power supply (UPS) operation to supply power to the load 400. Also, the energy storage system 100, even when the system 300 is in a normal state, may supply power produced by the power generation system 200 or power stored in the battery system 20 to the load 400.

The energy storage system 100 may include a power conversion system (PCS) 10 for controlling power conversion, the battery system 20, a first switch 30, a second switch 30, etc.

The PCS 10 converts power of the power generation system 200, the system 300, and the battery system 20 into an appropriate form of the power and supplies the converted power to where the power is needed. The PCS 10 may include a power conversion unit 11, a direct current (DC) link unit 12, an inverter 13, a converter 14, and an integrated controller 15.

The power conversion unit 11 may be connected to the power generation system 200 and the DC link unit 12. The power conversion unit 11 delivers power produced by the power generation system 200 to the DC link unit 12, and in this case, converts an output voltage into a DC link voltage.

The power conversion unit 11 may include a converter, a rectifier circuit, or the like, according to the kind of the power generation system 200. If power produced by the power generation system 200 is DC, the power conversion unit 11 may be a converter for converting DC into DC. If power produced by the power generation system 200 is alternating current (AC), the power conversion unit 11 may be a rectifier circuit for converting the AC power into a DC power. If the power generation system 200 is a solar light power generation system, the power conversion unit 11 may include a maximum power point tracking (MPPT) converter that performs a MPPT control so that the power generation system 200 produces a maximum power according to change in an solar light amount, temperature, or the like. The power conversion unit 11 may stop its operation when the power generation system 200 does not produce power, so that power consumed by, for example, a converter may be minimized.

A DC link voltage may be unstable due to, for example, an instantaneous voltage sag in the power generation system 200 or the system 300 or a peak charge in the load 400. The DC link voltage, however, need to be stabilized to perform the converter 14 and the inverter 13 normally. The DC link unit 12 is connected to the power conversion unit 11 and the inverter 13 to maintain the DC link voltage constant. The DC link unit 12 may be, for example, a large-size capacitor.

The inverter 13 is a power inversion apparatus and is connected to the DC link unit 12 and the first switch 30. The inverter 13 may include an inverter that inverts, in a discharge mode, a DC link voltage output by the power generation system 200 and/or battery system 20 into an AC voltage of the system 300. Also, the inverter 13 may include, to store power of the system 300 in the battery system 20 in a charge mode, a rectifying circuit that rectifies an AC voltage of the system 300 to produce a DC link voltage and outputs the DC link voltage. That is, the inverter 13 may be a bidirectional inverter of which input and output directions may be changed.

The inverter 13 may include a filter for removing a harmonic wave from an AC voltage that is output to the system 300. Also, the inverter 13 may include a phase locked loop (PLL) circuit for synchronizing a phase of an AC voltage output by the inverter 13 and a phase of the AC voltage of the system 300 to suppress production of reactive power. Also, the inverter 13 may perform a function of, for example, voltage variation range restriction, power-factor improvement, DC component removal, transient phenomena protection, or the like. The inverter 13 may stop its operation to minimize consumption of power during not-use.

The converter 14 is a power inversion apparatus and is connected to the DC link unit 12 and the battery system 20. The converter 14 may include a converter that DC-DC converts power stored in the battery system 20 to a voltage level required by the inverter 13, that is, a DC link voltage in a discharge mode. Also, the converter 14 may include a converter that DC-DC converts, in a charge mode, a voltage of power output by the power conversion unit 11 or power output by the inverter 13 into a voltage level required by the battery system 20, that is, a charge voltage. That is, the converter 14 may be a bidirectional converter of which input and output directions may be changed. The converter 14 may stop its operation to minimize consumption of power when charging or discharging of the battery system 20 is not needed.

The integrated controller 15 monitors states of the power generation system 200, the system 300, the battery system 20, and the load 400, and according to the monitoring results, controls the power conversion unit 110, the inverter 13, the converter 14, the battery system 20, the first switch 30, and the second switch 40. For example, the integrated controller 15 monitors: whether power interruption occurs in the system 300; whether the power generation system 200 produces power; if the power generation system 200 produces power, the power production amount; a state of charge (SOC) of the battery system 20; a power amount consumed by the load 400; time, or the like. Also, if power supplied to the load 400 is not sufficient, for example, if power interruption occurs in the system 300 integrated controller 15, the load 400 may be controlled in such a way that a priority sequence of power-using devices included in the load 400 is determined and then according to the priority sequence, power is sequentially supplied thereto.

The first switch 30 and the second switch 40 are connected to each other in series between the inverter 13 and the system 300, and perform on/off operations according to control of the integrated controller 15 to control the flow of current between the power generation system 200 and the system 300. The on/off of the first switch 15 and the second switch 16 may be determined according to states of the power generation system 200, the system 300, and the battery system 20.

In detail, if power of the power generation system 200 and/or battery system 20 is supplied to the load 400 or if power of the system 300 is supplied to the battery system 20, the first switch 30 is turned on. If power of the power generation system 200 and/or battery system 20 is supplied to the system 300, or if power of the system 300 is supplied to the load 400 and/or battery system 20, the second switch 40 is turned on.

Also, if power interruption occurs in the system 300, the second switch 40 is turned off and the first switch 30 is turned on. That is, power produced by the power generation system 200 and/or battery system 20 is supplied to the load 400 and, at the same time, a flow of power that is intended to be supplied to the load 400 toward the system 300 is prevented. Thus, an individual operation of the energy storage system 100 is prevented so that an electric shock of a people working near, for example, a power line of the system 300 due to power supplied by the energy storage system 100 may be prevented.

For use as the first switch 30 and the second switch 40, a switching apparatus, such as a relay, that endures a high amplitude of current may be used.

The battery system 20 stores power supplied by the power generation system 200 and/or the system 300, and supplies power stored in the load 400 or the system 300. The battery system 20 may include a portion for storing power and a portion for controlling the stored power. Hereinafter, the battery system 20 is described in detail with reference to FIG. 2.

A simulation apparatus 500 verify the battery system 20 by outputting an imaginary simulation voltage, which represents a voltage of a cell and a rack, to the battery system 20, and receiving cell and rack control results of the battery system 20 obtained using the simulation voltage. Hereinafter, the simulation apparatus 500 is described in detail below with reference to FIG. 3.

Figure 2:
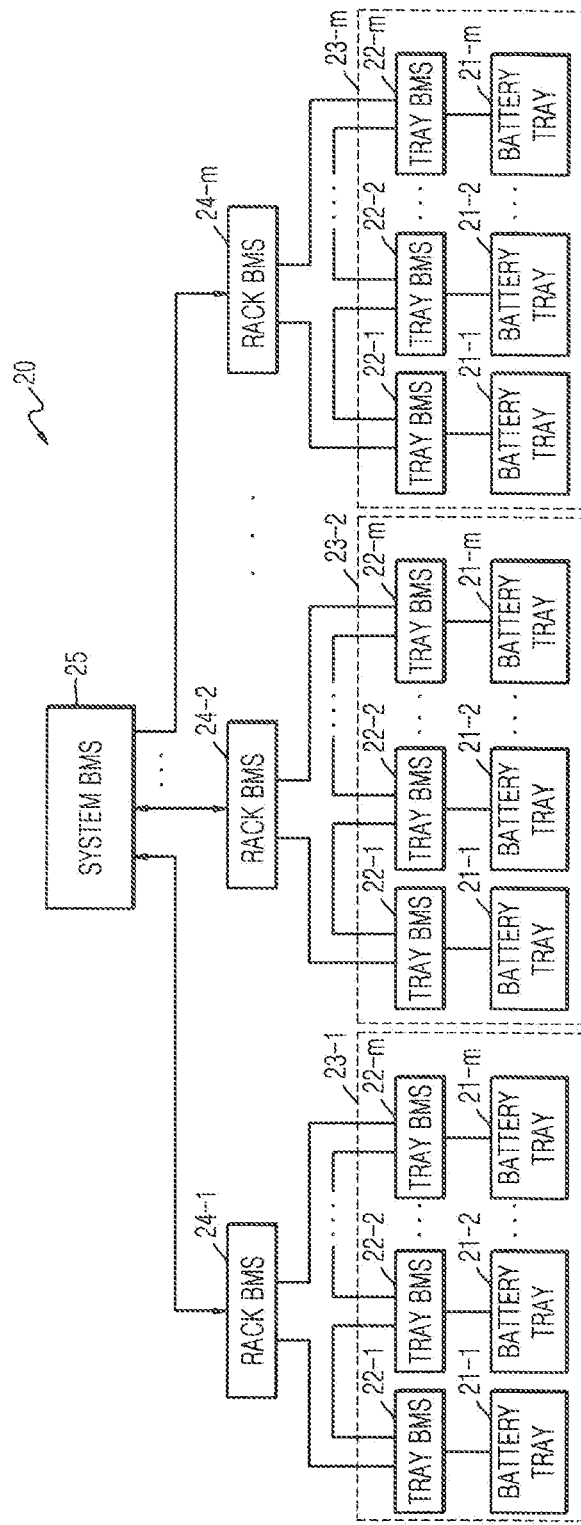
FIG. 2 is a diagram of a battery system included in the energy storage system of FIG. 1.

FIG. 2 is a diagram of the battery system 20 included in the energy storage system of FIG. 1.

Referring to FIG. 2, the battery system 20 may include one or more battery racks 23-1 through 23-$m$ and rack battery management systems (BMSs) 24-1 through 24-$m$ for controlling the battery racks 23-1 through 23-$m$ and battery racks 23-1 through 23-$m$. The battery racks 23-1 through 23-$m$ may each include battery trays 21-1 through 21-$m$ and tray BMS 22-1 through 22-$m$ for controlling the battery trays 21-1 through 21-$m$. The battery system 20 also includes a system BMS 25 for controlling rack BMSs 24-1 through 24-$m$.

The battery trays 21-1 through 21-$m$ may each include at least one battery cell. The battery cell may be a nickel-cadmium battery, a lead storage battery, a nickel metal hydride (NiMH) battery, a lithium ion battery, a lithium polymer battery, or the like. The battery cells included in the battery trays 21-1 through 21-$m$ may be connected to each other in series or parallel, or in combination thereof Also, the battery trays 21-1 through 21-$m$ may be connected to each other in series. The alignment of the battery trays 21-1 through 21-$m$, however, is not limited thereto, and the battery trays 21-1 through 21-$m$ may be connected to each other in parallel or series.

The tray BMS 22-1 through 22-$m$ may monitor the voltage, current, temperature, or residual capacity of each of the battery cells included in the battery trays 21-1 through 21-$m$, and according to monitoring results, may control charging and discharging of the battery trays 21-1 through 21-$m$. Also, to protect the battery trays 21-1 through 21-$m$, the tray BMS 22-1 through 22-$m$ may perform an overcharge protection function, an over-discharge protection function, an excess current protection function, an excess voltage protection function, an over heating protection function, a cell balancing function, or the like, according the monitoring results. The tray BMS 22-1 through 22-$m$ may transmit monitoring results to the rack BMS 24-1 through 24-$m$ and may receive a control signal transmitted by the rack BMS 24-1 through 24-$m$ to control the battery trays. 21-1 through 21-$m$.

The rack BMS 24-1 through 24-$m$ monitors the voltage, current, temperature, or residual capacity of the battery racks 23-1 through 23-$m$, and according to monitoring results, controls charging and discharging of the battery racks 23-1 through 23-$m$. Also, to protect the battery racks 23-1 through 23-$m$, the rack BMSs 24-1 through 24-$m$ may perform an overcharge protection function, an over-discharge protection function, an excess current protection function, an excess voltage protection function, an over heating protection function, a cell balancing function, or the like, according the monitoring results. The rack BMS 24-1 through 24-$m$ may transmit the monitoring results to the system BMS 25, and may receive a control signal transmitted by the system BMS 25 to control the battery racks 23-1 through 23-$m$.

The battery racks 23-1 through 23-$m$ may be connected to each other in parallel. The alignment of the battery racks 23-1 through 23-$m$, however, is an example, and the battery racks 23-1 through 23-$m$ may be connected to each other in series or parallel, or in combination thereof.

Also, the battery racks 23-1 through 23-$m$ may output power for supply to the load 400 and the system 300 according to control of the rack BMS 24-1 through 24-$m$. Also, the battery racks 23-1 through 23-m may output power for driving the system BMS 25 when an external power as a driving power is not supplied to the system BMS 25.

Figure 3:
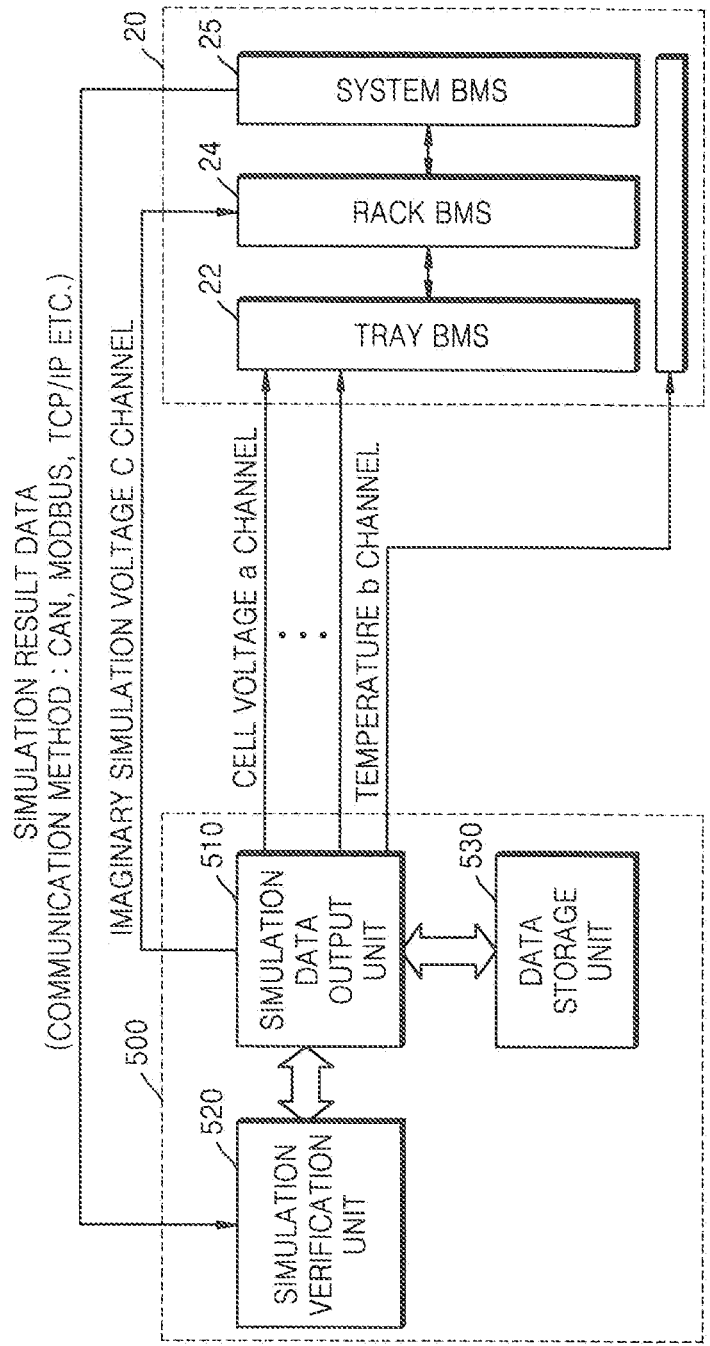
FIG. 3 is a diagram of a battery system simulation apparatus constructed as an embodiment according to the principles of the present invention.

FIG. 3 is a diagram of a battery system simulation apparatus according to an embodiment of the present invention.

Referring to FIG. 3, the simulation apparatus 500 may include a simulation data output unit 510, a simulation data verification unit 520, and a storage unit 530. Also, the simulation apparatus 500 may exchange data with the system BMS 25 of the battery system 20.

The simulation data output unit 510 may output an imaginary simulation voltage, which represents a voltage of a cell or a rack, to the battery system 20. In detail, the simulation data output unit 510 may output an imaginary simulation voltage, which represents a voltage of a cell, to a tray BMS 22. The simulation data output unit 510 may output a cell voltage via an a channel, for example, a 16 channel to the tray BMS 22, and may output temperature via a b channel, for example, a 3 channel to the tray BMS 22. Also, the simulation data output unit 510 may output an imaginary simulation voltage, which represents a voltage of a rack, to the rack BMS 24. The simulation data output unit 510 may output a rack voltage or current to the rack BMS 24 via a c channel, for example, a 1 channel.

In this regard, the storage unit 530 may store the imaginary simulation voltage, which represents a voltage of a cell and a rack. In detail, the storage unit 530 may store a voltage indicating charge and discharge states, State Of Charge (SOC)/State Of Power (SOP)/State Of Health (SOH) states, and protection states of excess voltage/low voltage/excess temperature/low temperature/excess current/low current of a cell or a rack.

The battery system 20 receives the imaginary simulation voltage, which represents a voltage of a cell and a rack, applied by the simulation data output unit 510, and generates control results of the tray BMS 22 and the rack BMS 24 by using imaginary simulation voltage.

In detail, the tray BMS 22 receives a voltage that indicates charge and discharge states, SOC/SOP/SOH states, and protection states of excess voltage/low voltage/excess temperature/low temperature/excess current/low current of a cell or a rack, applied by the simulation data output unit 510, and according to the voltage, the tray BMS 22 generates imaginary cell control result data. For example, the tray BMS 22 which receives a voltage of a cell when the cell is charged or discharged according to temperature may produce control results regarding charging and discharging of a cell at a particular temperature. Also, the tray BMS 22 may produce SOC/SOP/SOH control results at a particular voltage. Also, the tray BMS 22 may produce protection state and control results at a particular voltage and a particular temperature. Such control results produced by the tray BMS 22 are transmitted to the system BMS 25 via the rack BMS 24.

Likewise, the rack BMS 24 receives a voltage that indicates charge and discharge states, SOC/SOP/SOH states, and protection states of excess voltage/low voltage/excess temperature/low temperature/excess current/low current of a rack, applied by the simulation data output unit 510, and according to the voltage, the rack BMS 24 generates imaginary cell control result data. Control results produced by the rack BMS 22 are transmitted to the system BMS 25.

The system BMS 25 receives control result data transmitted by the tray BMS 22 and the rack BMS 24, and transmits the control result data to the simulation verification unit 520. The system BMS 25 and the simulation verification unit 520 may exchange data with each other by using various communication methods, including Controller Area Network (CAN), MODBUS, Transmission Control Protocol and Internet Protocol (TCP/IP), RS485, RS422, or the like.

The simulation verification unit 520 verifies the battery system 20 by using simulation voltage based on control result data which are produced by the tray BMS 22 and rack BMS 24 and transmitted by the system BMS 25. The simulation verification unit 520 may verify BMS firmware verification efficiency due to construction of firmware automatic verification by receiving control result data, may verify communication and charge and discharge characteristics with the battery system 20, may detect actual test problems in advance through various charge and discharge pattern tests on products, and may verify fuel gauge accuracy and a protection function through multiple condition operation firmware evaluations with regard to, for example, voltage, current, and temperature.

The simulation apparatus 500 may be driven in two modes: a normal mode and a user mode. In a normal mode, the simulation apparatus 500 outputs, as imaginary data, temperature/current/voltage values which are changed in a stereotyped charge and discharge method, such as a method of a constant current-constant voltage (CC-CV) charging/constant current (CC) discharging or a constant power (CP) charging and discharging, to the battery system 20, and receives data about charge and discharge cycles, SOC/SOP/SOH accuracy and protection states transmitted by the battery system 20 to verify the battery system 20. For example, in the normal mode, the simulation apparatus 500 may output an imaginary simulation voltage that varies according to temperature in the stereotyped charge and discharge method.

In a user mode, the simulation apparatus 500 outputs, as imaginary data, temperature/current/voltage values which are arbitrarily changed in a free charge and discharge method to the battery system 20 to verify the battery system 20. That is, profiles of the tray BMS 22 and the rack BMS 24 are arbitrarily changed, and data about discharge cycles, SOC/SOP/SOH accuracy, and protection states are received to verify the battery system 20. For example, in the user mode, the simulation apparatus 500 may output an imaginary simulation voltage that varies according to temperature in the free charge and discharge method.

FIG. 4 is a flowchart illustrating a method of simulating a battery system, according to an embodiment of the present invention.

Referring to FIG. 4, the simulation apparatus 500 determines an operation mode (S10). The simulation apparatus 500 may be driven in a normal mode or a user mode. In a normal mode, the simulation apparatus 500 may, in a stereotyped charge and discharge method, outputs changed temperature/current/voltage values as imaginary data to the battery system 20. In a user mode, the simulation apparatus 500 may, in an arbitrarily charge and discharge method, output arbitrarily changed temperature/current/voltage values as imaginary data to the battery system 20.

When the operation mode is determined, the simulation apparatus 500 may produce an imaginary simulation voltage according to the determined operation mode and may apply the imaginary simulation voltage to the battery system 20 (S20). The simulation apparatus 500 may apply a simulation voltage for verifying charge and discharge states, SOC/SOP/SOH states, and protection states of excess voltage/low voltage/excess temperature/low temperature/excess current/low current of a cell or a rack to the battery system 20.

After the battery system 20 receives the imaginary simulation voltage through channels, the battery system 20 produces control results of the trays BMS and the rack BMS (S30). The control results of the trays BMS and the rack BMS are produced according to the simulation voltage, and are integrated by the system BMS 25.

The battery system 20 transmits the control results of the trays BMS and the rack BMS to the simulation apparatus 500 (S40).

The simulation apparatus 500 may receive the control results of the trays BMS and the rack BMS transmitted by the battery system 20 to verify the battery system 20 (S50). The simulation apparatus 500 may verify BMS firmware verification efficiency due to construction of firmware automatic verification by receiving the control result data of the trays BMS and rack BMS, may verify communication and charge and discharge characteristics with the battery system 20, may detect actual test problems in advance through various charge and discharge pattern tests on products, and may verify fuel gauge accuracy and a protection function through multiple condition operation firmware evaluations with regard to, for example, voltage, current, and temperature.

As described above, according to the one or more of the above embodiments of the present invention, a battery system may be stably used by performing a test using simulation data.

In addition, the BMS firmware verification efficiency due to construction of firmware automatic verification may be enhanced, and communication and charge and discharge matching characteristics may be confirmed through a model test with a PCS. Also, actual test problems may be detected in advance through various charge and discharge pattern tests on products, fuel gauge accuracy and a protection function may be verified through multiple condition operation firmware evaluations with regard to, for example, voltage, current, and temperature, and change in a BMS as a general verification system, a cell, and a customer specification can be responded and thus additional manufacturing costs may be reduced.

The particular implementations shown and described herein are illustrative examples of the invention and are not intended to otherwise limit the scope of the invention in any way. For the sake of brevity, conventional electronics, control systems, software, and other functional aspects of the systems may not be described in detail. Furthermore, the connecting lines or connectors shown in the various figures presented are intended to represent exemplary functional relationships and/or physical or logical couplings between the various elements. It should be noted that many alternative or additional functional relationships, physical connections, or logical connections may be present in a practical device. Moreover, no item or component is essential to the practice of the invention unless the element is specifically described as "essential" or "critical."

The use of the terms "a" and "an" and "the" and similar referents in the context of describing the invention especially in the context of the following claims should be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein are performable in any suitable order unless otherwise indicated herein or otherwise clearly contradicted by context. The use of any and all examples or exemplary language e.g., "such as" provided herein, is intended merely to better illuminate the invention and does not pose a limitation on the scope of the invention unless otherwise claimed. Moreover, it is well understood by one of ordinary skill in the art that numerous modifications, adaptations, and changes may be made under design conditions and factors without departing from the spirit and scope of the invention as defined by the following claims and within the range of equivalents thereof.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A simulation apparatus, comprising:
 a voltage simulator that outputs an imaginary simulation voltage corresponding to a battery included in a battery system, to a battery management unit that controls operation of the battery; and
 a simulation verification unit that receives control results for the battery generated in dependence upon the imaginary simulation voltage, the control results being transmitted by the battery management unit.

2. The simulation apparatus of claim 1, further comprising a storage unit that stores the imaginary simulation voltage corresponding to the battery.

3. The simulation apparatus of claim 2, wherein the storage unit stores a plurality of imaginary simulation voltages corresponding to a battery cell and a battery rack, respectively.

4. The simulation apparatus of claim 3, wherein the imaginary simulation voltage indicates-charge and discharge states, State Of Charge (SOC), State Of Power (SOP), State Of Health (SOH) states, and protection states of excess voltage, low voltage, excess temperature, low temperature, excess current, low current for the battery cell and for the battery rack.

5. The simulation apparatus of claim 1, wherein the battery system comprises:
 a plurality of tray management units for controlling a plurality of battery trays each comprising at least one battery cell; and
 a plurality of rack management units for controlling the tray management units.

6. The simulation apparatus of claim 5, wherein the voltage simulator outputs imaginary simulation voltages corresponding to the battery cells to the tray management units.

7. The simulation apparatus of claim 5, wherein the voltage simulator outputs an imaginary simulation voltage corresponding to the rack to the rack management unit.

8. The simulation apparatus of claim 5, further comprising a system management unit for controlling the rack management units.

9. The simulation apparatus of claim 8, wherein the simulation verification unit receives battery control results transmitted by the system management unit.

10. The simulation apparatus of claim 1, wherein the voltage simulator outputs different imaginary simulation voltages according to a normal mode or a user mode.

11. The simulation apparatus of claim 1, wherein the voltage simulator is driven in the normal mode in which an imaginary simulation voltage that varies according to temperature in a stereotyped charge and discharge method is output.

12. The simulation apparatus of claim 1, wherein the voltage simulator is driven in the user mode in which an imaginary simulation voltage that varies according to temperature in a free charge and discharge method is output.

13. The simulation apparatus of claim 1, wherein the simulation verification unit performs at least one of the following verifications:

a verification of a battery management system firmware verification efficiency based on construction of firmware automatic verification;
a verification of communication and charge and discharge characteristics of the battery system;
a detection of actual test problems in advance through various charge and discharge pattern tests on products; and
a verification of fuel gauge accuracy and a protection function based on multiple condition operation firmware evaluations with regard to voltage, current, and temperature.

\* \* \* \* \*